(12) United States Patent
Ono

(10) Patent No.: US 11,136,497 B2
(45) Date of Patent: Oct. 5, 2021

(54) MULTICORE-SHELL PARTICLE, NANOPARTICLE DISPERSION LIQUID, AND FILM

(71) Applicant: FUJIFILM Corporation, Tokyo (JP)

(72) Inventor: Masashi Ono, Ashigara-kami-gun (JP)

(73) Assignee: FUJIFILM Corporation, Tokyo (JP)

(*) Notice: Subject to any disclaimer, the term of this patent is extended or adjusted under 35 U.S.C. 154(b) by 393 days.

(21) Appl. No.: 15/812,413

(22) Filed: Nov. 14, 2017

(65) Prior Publication Data

US 2018/0066181 A1 Mar. 8, 2018

Related U.S. Application Data

(63) Continuation of application No. PCT/JP2016/063748, filed on May 9, 2016.

(30) Foreign Application Priority Data

May 15, 2015 (JP) .............................. JP2015-099650

(51) Int. Cl.

| C09K 11/08 | (2006.01) |
|---|---|
| C09K 11/56 | (2006.01) |
| C09K 11/02 | (2006.01) |
| B82Y 40/00 | (2011.01) |
| C09K 11/54 | (2006.01) |
| C09K 11/62 | (2006.01) |
| C09K 11/70 | (2006.01) |
| H01L 33/04 | (2010.01) |
| H01L 51/00 | (2006.01) |
| B82Y 20/00 | (2011.01) |
| B82Y 30/00 | (2011.01) |
| H01L 51/50 | (2006.01) |

(52) U.S. Cl.
CPC .......... *C09K 11/0883* (2013.01); *B82Y 40/00* (2013.01); *C09K 11/025* (2013.01); *C09K 11/54* (2013.01); *C09K 11/56* (2013.01); *C09K 11/565* (2013.01); *C09K 11/62* (2013.01); *C09K 11/70* (2013.01); *H01L 33/04* (2013.01); *H01L 51/004* (2013.01); *B82Y 20/00* (2013.01); *B82Y 30/00* (2013.01); *C09K 2211/188* (2013.01); *H01L 51/502* (2013.01)

(58) Field of Classification Search
CPC .................................................. C09K 11/0883
See application file for complete search history.

(56) References Cited

U.S. PATENT DOCUMENTS

2005/0268956 A1 12/2005 Take
2007/0057263 A1 3/2007 Kahen
2007/0281160 A1 12/2007 Krishna et al.
2009/0117161 A1 5/2009 Giapis et al.
2009/0230382 A1 9/2009 Banin et al.
2014/0326949 A1 11/2014 Xu et al.

FOREIGN PATENT DOCUMENTS

| EP | 1929531 A2 * | 6/2008 | ....... H01L 27/14634 |
|---|---|---|---|
| JP | 2005-294478 A | 10/2005 | |
| JP | 2007-320847 A | 12/2007 | |
| JP | 2009-508356 A | 2/2009 | |
| JP | 2009-509129 A | 3/2009 | |
| JP | 5137825 B2 | 2/2013 | |
| JP | 2015-505860 A | 2/2015 | |
| WO | WO 2007/102051 A2 | 9/2007 | |

OTHER PUBLICATIONS

Brito-Silva et al., "Engineering of CdTe Multicore in ZnO Nanoshell as a New Charge-Transfer Material," J. Phys. Chem. C, vol. 118, Jul. 29, 2014, pp. 18372-18376.
International Preliminary Report on Patentability and Written Opinion of the International Searching Authority (Forms PCT/IB/326, PCT/IB/373 and PCT/ISA/237) for International Application No. PCT/JP2016/063748, dated Nov. 30, 2017, with an English translation of the Written Opinion.
International Search Report (Form PCT/ISA/210) for International Application No. PCT/JP2016/063748, dated Jul. 26, 2016, with English translation.
Kim et al., "Highly Luminescent InP/GaP/ZnS Nanocrystals and Their Application to White Light-Emitting Diodes," J. Am. Chem. Soc., vol. 134, Feb. 3, 2012, pp. 3804-3809.
Murray et al., "Synthesis and Characterization of Nearly Monodisperse CdE (E=S, Se, Te) Semiconductor Nanocrystallites," J. Am. Chem. Soc., vol. 115, No. 19, 1993, pp. 8706-8715.
Ramírez-Ortega et al., "Semiconducting Properties of $ZnO/TiO_2$ Composites by Electrochemical Measurements and Their Relationship with Photocatalytic Activity," Electrochimica Acta, vol. 140, 2014 (published online Jun. 17, 2014), pp. 541-549.
Japanese Notification of Reasons for Refusal, dated Oct. 23, 2018, for corresponding Japanese Patent Application No. 2017-519123, with English translation.

* cited by examiner

Primary Examiner — Christopher S Kessler

(74) Attorney, Agent, or Firm — Birch, Stewart, Kolasch & Birch, LLP

(57) ABSTRACT

An object of the present invention is to provide a multicore shell particle having excellent photostability; a nanoparticle dispersion liquid containing the multicore shell particle; and a film obtained by using the multicore shell particle. A multicore shell particle of the present invention includes a plurality of semiconductor cores; and a semiconductor shell A which contains the plurality of semiconductor cores.

10 Claims, No Drawings

MULTICORE-SHELL PARTICLE, NANOPARTICLE DISPERSION LIQUID, AND FILM

CROSS-REFERENCE TO RELATED APPLICATIONS

This application is a Continuation of PCT International Application No. PCT/JP2016/063748 filed on May 9, 2016, which claims priority under 35 U.S.C. § 119(a) to Japanese Patent Application No. 2015-099650 filed on May 15, 2015. The above application is hereby expressly incorporated by reference, in its entirety, into the present application.

BACKGROUND OF THE INVENTION

1. Field of the Invention

The present invention relates to a core shell particle, and a nanoparticle dispersion liquid and a film which contain the core shell particle.

2. Description of the Related Art

As semiconductor fine particles which are expected to be applied to colloidal semiconductor nanoparticles (so-called quantum dots), Group II-VI semiconductor fine particles or Group III-V semiconductor fine particles have been known.

The particle diameter of these semiconductor fine particles is several nanometers to several tens of nanometers.

Further, a band gap typically becomes larger as the particle diameter of particles having such a nanoscale decreases due to so-called quantum size effects, and the particles exhibit light emission in a short wavelength range such as an ultraviolet region or a near ultraviolet region.

Therefore, in order to use optical characteristics specific to the semiconductor fine particles, applications to various devices such as a piezoelectric element, an electronic device, a light-emitting element, and a laser have been researched and developed.

After suggestion of a hot soap method (also referred to as a hot injection method) which is a chemical synthesis method of quantum dots in "Synthesis and Characterization of Nearly Monodisperse CdE (E=S, Se, Te) Semiconductor Nanocrystallites" J. Am. Chem. Soc., written by C. B. Murray et al., No. 115, pp. 8706 to 8715 (1993), the research of quantum dots has been actively performed around the world.

Further, the examination of the quantum dots was performed mainly on a Group II-VI semiconductor containing a Cd element or a Pb element at the time of initial research, but the research of quantum dots which do not contain a Cd element or a Pb element has been recently suggested since the Cd element and the Pb element are substances regulated as Restriction on Hazardous Substances (Rohs) or the like (for example, JP5137825B and "Highly Luminescent InP/GaP/ZnS Nanocrystals and Their Application to White Light-Emitting Diodes" Journal of the American Chemical Society 134, written by S. Kim et al., 3804-3809 (2012).

SUMMARY OF THE INVENTION

As a result of research on core shell particles having a multilayer shell layer described in JP5137825B and "Highly Luminescent InP/GaP/ZnS Nanocrystals and Their Application to White Light-Emitting Diodes" Journal of the American Chemical Society 134, written by S. Kim et al., 3804-3809 (2012)), the present inventors found that the luminous efficacy is decreased due to irradiation with ultraviolet rays or the like and thus the photostability of the core shell particles is degraded even in a case where core shell particles exhibiting high luminous efficacy are obtained.

An object of the present invention is to provide a multicore shell particle having excellent photostability, a nanoparticle dispersion liquid containing the multicore shell particle, and a film obtained by using the multicore shell particle.

As the result of intensive research conducted by the present inventors in order to achieve the above-described object, it was found that a multicore shell particle which includes a semiconductor core and a semiconductor shell including a plurality of semiconductor cores has excellent photostability, and the present invention has been completed.

In other words, it was found that the above-described object can be achieved by the following configurations.

[1] A multicore shell particle comprising: a plurality of semiconductor cores; and a semiconductor shell A which contains the plurality of semiconductor cores.

[2] The multicore shell particle according to [1], in which the plurality of semiconductor cores each independently have a semiconductor shell B which covers at least a part of a surface of the semiconductor core.

[3] The multicore shell particle according to [1] or [2], in which the semiconductor core is a semiconductor core which contains a Group III element and a Group V element.

[4] The multicore shell particle according to [3], in which the Group III element contained in the semiconductor core is In, and the Group V element contained in the semiconductor core is any of P, N, and As.

[5] The multicore shell particle according to [3], in which the Group III element contained in the semiconductor core is In, and the Group V element contained in the semiconductor core is P.

[6] The multicore shell particle according to any one of [3] to [5], in which the semiconductor core further contains a Group II element.

[7] The multicore shell particle according to [6], in which the Group II element contained in the semiconductor core is Zn.

[8] The multicore shell particle according to any one of [2] to [7], in which the semiconductor shell B contains a Group II element and a Group III element.

[9] The multicore shell particle according to any one of [2] to [8], in which the semiconductor shell B is a Group II-VI semiconductor which contains a Group II element and a Group VI element or a Group III-V semiconductor which contains a Group III element and a Group V element.

[10] The multicore shell particle according to [9], in which in a case where the semiconductor shell B is the Group II-VI semiconductor, the Group II element is Zn and the Group VI element is Se, and in a case where the semiconductor shell B is the Group III-V semiconductor, the Group III element is Ga and the Group V element is P.

[11] The multicore shell particle according to [9], in which the semiconductor shell B is the Group III-V semiconductor, the Group III element is Ga, and the Group V element is P.

[12] The multicore shell particle according to any one of [1] to [11], in which the semiconductor shell A is a Group II-VI semiconductor which contains a Group II element and a Group VI element or a Group III-V semiconductor which contains a Group III element and a Group V element.

[13] The multicore shell particle according to [12], in which the semiconductor shell A is the Group II-VI semiconductor, the Group II element is Zn, and the Group VI element is S.

[14] The multicore shell particle according to any one of [2] to [13], in which the semiconductor core, the semiconductor shell A, and the semiconductor shell B are respectively a crystal system having a zinc blende structure.

[15] The multicore shell particle according to any one of [2] to [14], in which, among the semiconductor core, the semiconductor shell A, and the semiconductor shell B, a band gap of the semiconductor core is the smallest, and the semiconductor core and the semiconductor shell B respectively have a type 1 band structure.

[16] A nanoparticle dispersion liquid comprising: the multicore shell particle according to any one of [1] to [15].

[17] The nanoparticle dispersion liquid according to [16], further comprising: a single core shell particle which includes a semiconductor core and a semiconductor shell covering at least a part of a surface of the semiconductor core.

[18] The nanoparticle dispersion liquid according to [17], in which the proportion of the multicore shell particle is in a range of 10% to 50% with respect to the total amount of the core shell particle obtained by summing the amount of the multicore shell particle and the amount of the single core shell particle.

[19] A film which contains the multicore shell particle according to any one of [1] to [15].

According to the present invention, it is possible to provide a multicore shell particle having excellent photostability; a nanoparticle dispersion liquid containing the multicore shell particle; and a film obtained by using the multicore shell particle.

DESCRIPTION OF THE PREFERRED EMBODIMENTS

Hereinafter, the present invention will be described in detail.

The description of constituent elements below will be occasionally made based on representative embodiments of the present invention, but the present invention is not limited to those embodiments.

In the present specification, the numerical ranges expressed using "to" in the present specification indicate the ranges including the numerical values described before and after "to" as the lower limits and the upper limits.

[Multicore Shell Particle]

The multicore shell particle of the present invention includes a plurality of semiconductor cores and a semiconductor shell A including the plurality of semiconductor cores.

In other words, the multicore shell particle of the present invention has a sea-island structure having the plurality of semiconductor cores as islands and the semiconductor shell A as sea.

Further, it is preferable that the semiconductor core included in the multicore shell particle of the present invention includes a semiconductor shell B that covers at least a part of the surface of the semiconductor core. Here, the semiconductor shell B is a semiconductor shell which is different from the above-described semiconductor shell A and covers each of the plurality of semiconductor cores independently (individually).

Since the multicore shell particle of the present invention includes the semiconductor shell A including a plurality of semiconductor cores, the photostability becomes excellent.

The reason why the photostability becomes excellent is not clear yet, but can be assumed as follows.

First, since the multicore shell particle containing the semiconductor shell A includes a plurality of semiconductor cores, the structure of the multicore shell particle becomes larger than the structure of the single core shell particle which does not include the semiconductor shell A (that is, a core shell particle obtained by individually coating one semiconductor core with a semiconductor shell), and the thickness or the coating amount of the semiconductor shell A become larger than those of a semiconductor shell with which one semiconductor core is individually coated.

Accordingly, in the multicore shell particle including the semiconductor shell A, the photostability is considered to become excellent because the influence of oxidation of the semiconductor core and moisture adsorption to the semiconductor core can be easily suppressed.

Further, since the multicore shell particle including the semiconductor shell A has a large structure as described above and the surface area thereof with respect to the volume is decreased, the surface thereof can be easily coated with coordination molecules even in a case of including arbitrary coordination molecules, and an effect of suppressing surface defects can be expected.

Further, since a possibility of simultaneous disappearance of light emission of all semiconductor cores included in the multicore shell particle including the semiconductor shell A even when a light emission blinking phenomenon occurs in the semiconductor cores is low, the applications of the multicore shell particle for biological labeling are considered to be suitable.

[Semiconductor Core]

The semiconductor core included in the multicore shell particle of the present invention is not particularly limited, and a core material constituting quantum dots known in the related art can be appropriately used.

In the present invention, from the viewpoints of obtaining an excellent crystal phase with less defects and easily realizing high luminous efficacy, it is preferable that the semiconductor core is a so-called Group III-V semiconductor containing a Group III element and a Group V element.

<Group III Element>

Specific examples of the Group III element include indium (In), aluminum (Al), and gallium (Ga). Among these, In is preferable.

<Group V Element>

Specific examples of the Group V element include phosphorus (P), nitrogen (N), and arsenic (As). Among these, P is preferable.

In the present invention, a Group III-V semiconductor obtained by appropriately combining the Group III element and the Group V element exemplified above can be suitably used as the semiconductor core, but InP, InN, or InAs is preferable from the viewpoint that the luminous efficacy is increased, the luminous half-width is narrowed, and a clear exciton peak is obtained. Among these, from the viewpoint of further increasing the luminous efficacy, InP is more preferable.

In the present invention, it is preferable that the semiconductor core further contains a Group II element in addition to the Group III element and the Group V element described above. Particularly in a case where the core is InP, the lattice constant is decreased by doping Zn as the Group II element and the lattice matching performance with a shell (for example, GaP, ZnS, or the like described below) having a smaller lattice constant than that of InP becomes excellent.

[Semiconductor Shell A]

The semiconductor shell A included in the multicore shell particle of the present invention is a shell material including a plurality of the semiconductor cores described above.

In the present invention, from the viewpoints of suppressing defects of the interface between the semiconductor shell A and the semiconductor core or the semiconductor shell B and obtaining the semiconductor shell A having an excellent crystal phase with less defects, it is preferable that the semiconductor shell A is a Group II-VI semiconductor containing a Group II element and a Group VI element or a Group III-V semiconductor containing a Group III element and a Group V element. From the viewpoint of easily obtaining a shell having high reactivity of the material itself and high crystallinity, it is more preferable that the semiconductor shell A is a Group II-VI semiconductor.

<Group II-VI Semiconductor>

Specific examples of the Group II element contained in the Group II-VI semiconductor include zinc (Zn), cadmium (Cd), and magnesium (Mg). Among these, Zn is preferable.

Further, specific examples of the Group VI element contained in the Group II-VI semiconductor include sulfur (S), oxygen (O), selenium (Se), and tellurium (Te). Among these, S or Se is preferable and S is more preferable.

A Group II-VI semiconductor obtained by appropriately combining the Group II element and the Group VI element described above can be used as the semiconductor shell A, but it is preferable that the semiconductor shell A is a crystal system (for example, a zinc blende structure) which is the same as or similar to the semiconductor described above. Specifically, ZnSe, ZnS, or a mixed crystal of these is preferable and ZnS is more preferable.

<Group III-V Semiconductor>

Specific examples of the Group III element contained in the Group III-V semiconductor include indium (In), aluminum (Al), and gallium (Ga). Among these, Ga is preferable.

Further, specific examples of the Group V element contained in the Group III-V semiconductor include phosphorus (P), nitrogen (N), and arsenic (As). Among these, P is preferable.

A Group III-V semiconductor obtained by appropriately combining the Group III element and the Group V element described above can be used as the semiconductor shell A, but it is preferable that the semiconductor shell A is a crystal system (for example, a zinc blende structure) which is the same as or similar to the semiconductor described above. Specifically, GaP is preferable.

In the present invention, from the viewpoint of reducing defects of the surface of the core shell particle to be obtained, it is preferable that a difference in lattice constant between the semiconductor shell A and the semiconductor shell B in a case where the core shell particle includes the semiconductor core described above or the semiconductor shell B described below is small. Specifically, it is preferable that the difference in lattice constant is 10% or less.

For example, in a case where the above-described semiconductor core is InP, it is preferable that the semiconductor shell A is ZnS (difference in lattice constant: 7.8%). Further, in a case where the core shell particle includes GaP as the semiconductor shell B described above, it is preferable that the semiconductor shell A is ZnS (difference in lattice constant: 0.8%).

In the present invention, in a case where the semiconductor shell A is a Group II-VI semiconductor, the semiconductor shell A may contain or dope another element (for example, the Group III element or the Group V element described above) within the range that does not affect the magnitude correlation (semiconductor core<semiconductor shell A) of the band gap between the semiconductor core and the semiconductor shell A. Similarly, in a case where the semiconductor shell A is a Group III-V semiconductor, the semiconductor shell A may contain or dope another element (for example, the Group II element or the Group VI element described above) within the range that does not affect the magnitude correlation (semiconductor core<semiconductor shell A) of the band gap between the semiconductor core and the semiconductor shell A.

[Semiconductor Shell B]

The semiconductor core included in the multicore shell particle of the present invention includes the semiconductor shell B that covers at least a part of the surface of the semiconductor core, as described above.

Here, the semiconductor shell B is a semiconductor shell which is different from the above-described semiconductor shell A and covers each of the plurality of semiconductor cores independently (individually). In other words, in a case where the semiconductor core includes the semiconductor shell B, the semiconductor shell A includes a plurality of single core shell particles having the above-described semiconductor core and the semiconductor shell B.

Further, in the present invention, it is possible to confirm whether at least a part of the surface of the semiconductor core is covered with the semiconductor shell B based on composition distribution analysis according to energy dispersive X-ray spectroscopy (TEM-EDX) using a transmission electron microscope.

In the present invention, from the viewpoint of easily suppressing defects of the interface between the semiconductor core and the semiconductor shell B, it is preferable that the semiconductor shell B contains a Group II element or a Group III element.

Here, in a case where the semiconductor core and the semiconductor shell B respectively contain a Group III element, it is preferable that the Group III elements contained in the semiconductor core and the semiconductor shell B are different from each other. Further, in a case where the semiconductor core and the semiconductor shell B contain two or more Group III elements, at least one of the Group III elements may be different from the rest. For example, in a case where the semiconductor core contains In, it is preferable that the semiconductor B contains Ga, but may contain In or Ga.

Further, in addition to a Group II-VI semiconductor and a Group III-V semiconductor described below, a Group III-VI semiconductor (such as $Ga_2O_3$, $Ga_2S_3$, or the like) containing a Group III element and a Group VI element is exemplified as the semiconductor shell B containing a Group II element or a Group III element.

In the present invention, from the viewpoint of obtaining an excellent crystal phase with less defects, it is preferable that the semiconductor shell B is a Group II-VI semiconductor containing a Group II element and a Group VI element or a Group III-V semiconductor containing a Group III element and a Group V element and more preferable that the semiconductor shell B is a Group III-V semiconductor in which a difference in lattice constant between the semiconductor core described above and the semiconductor shell B is small.

Here, in a case where the semiconductor core contains a Group III element and the semiconductor shell B is a Group III-V semiconductor, it is preferable that the Group III elements contained in the semiconductor core and the semiconductor shell B are different from each other. Further, in a case where the semiconductor core and the semiconductor shell B contain two or more Group III elements, at least one of the Group III elements may be different from the rest. For example, in a case where the semiconductor core contains In, it is preferable that the semiconductor B contains Ga, but may contain In or Ga.

Examples of the Group II element, the Group VI element, the Group III element, and the Group V element include those described in the section of the semiconductor shell A.

A Group II-VI semiconductor obtained by appropriately combining the Group II element and the Group VI element described above can be used as the semiconductor shell B, but it is preferable that the semiconductor shell B is a crystal system (for example, a zinc blende structure) which is the same as or similar to the semiconductor core described above. Specifically, ZnSe is preferable.

A Group III-V semiconductor obtained by appropriately combining the Group III element and the Group V element described above can be used as the semiconductor shell B, but it is preferable that the semiconductor shell B is a crystal system (for example, a zinc blende structure) which is the same as or similar to the semiconductor core described above. Specifically, GaP is preferable.

In the present invention, from the viewpoint of reducing defects of the surface of the single core shell particle to be obtained, it is preferable that a difference in lattice constant between the above-described semiconductor core and the semiconductor shell B is small. Specifically, it is preferable that the difference in lattice constant is 10% or less.

For example, in a case where the above-described semiconductor core is InP, it is preferable that the semiconductor shell B is ZnSe (difference in lattice constant: 3.4%) or GaP (difference in lattice constant: 7.1%). Particularly, it is more preferable that the semiconductor shell B is the same Group III-V semiconductor as the semiconductor core and the Group III-V semiconductor is GaP from the viewpoint that a mixed crystal state can be easily made on the interface between the semiconductor core and the semiconductor shell B.

In the present invention, in a case where the semiconductor shell B is a Group III-V semiconductor, the semiconductor shell B may contain or dope another element (for example, the Group II element or the Group VI element described above) within the range that does not affect the magnitude correlation (semiconductor core<semiconductor shell B) of the band gap between the semiconductor core and the second shell B. Similarly, in a case where the semiconductor shell B is a Group II-VI semiconductor, the semiconductor shell B may contain or dope another element (for example, the Group III element or the Group V element described above) within the range that does not affect the magnitude correlation (semiconductor core<semiconductor shell B) of the band gap between the semiconductor core and the second shell B.

In the present invention, from the viewpoint that epitaxial growth becomes easy and defects of an interface between layers are easily suppressed, it is preferable that each of the semiconductor core, the semiconductor shell A, and the semiconductor shell B is a crystal system having a zinc blende structure.

In the present invention, from the viewpoint that the probability of excitons staying in the semiconductor core becomes higher and the luminous efficacy is further increased, it is preferable that the band gap of the semiconductor core from among the semiconductor core, the semiconductor shell A, and the semiconductor shell B is the smallest and the semiconductor core and the semiconductor shell B are core shell particles having a type 1 (type I) band structure.

[Coordination Molecule]

From the viewpoint of imparting dispersibility, it is desirable that the surface of the multicore shell particle of the present invention has coordination molecules.

From the viewpoint of dispersibility in a solvent, it is preferable that the coordination molecules contain aliphatic hydrocarbon.

Further, from the viewpoint of improving the dispersibility, a coordination molecule is preferably a ligand in which the number of carbon atoms in the main chain is at least 6 and more preferably a ligand in which the number of carbon atoms in the main chain is 10 or greater.

The coordination molecule may be a saturated compound or an unsaturated compound, and specific examples thereof include decanoic acid, lauric acid, myristic acid, palmitic acid, stearic acid, behenic acid, oleic acid, erucic acid, oleylamine, dodecylamine, dodecanethiol, 1,2-hexadecanethiol, trioctylphosphine oxide, and cetrimonium bromide, and these may be used alone or in combination of two or more kinds thereof.

[Average Particle Diameter]

From the viewpoints of easily synthesizing particles having a uniform size and easily controlling the emission wavelength using quantum size effects, the average particle diameter of the multicore shell particles of the present invention is preferably 2 nm or greater and more preferably 30 nm or less.

Here, the average particle diameter is a value obtained by directly observing at least 20 multicore shell particles using a transmission electron microscope, calculating the diameters of circles having the same area as the projected area of the particles, and arithmetically averaging these values.

[Method of Producing Core Shell Particles]

A method of producing multicore shell particles for synthesizing the multicore shell particles of the present invention (hereinafter, also referred to as the "production method of the present invention") is a method for synthesizing the multicore shell particles of the present invention described above. The method includes the first step to the fourth step described below.

A first step (1) of heating and stirring a solution obtained by adding a Group III raw material which contains a Group III element to a solvent A second step (2) of forming a semiconductor core by adding a Group V raw material which contains a Group V element to the solution after the first step A third step (3) of forming a semiconductor shell B by adding a raw material of the semiconductor shell B to the solution after the second step; and A fourth step (4) of synthesizing multicore shell particles by adding a raw material of the semiconductor shell A to the solution after the third step to form the semiconductor shell A Hereinafter, each step will be described.

[First Step]

The first step is a step of heating and stirring a solution obtained by adding a Group III raw material which contains a Group III element to a solvent.

<Solvent>

Preferred examples of the solvent used in the first step include non-polar solvents having a boiling point of 170° C. or higher.

Specific examples of the non-polar solvents include aliphatic saturated hydrocarbon such as n-decane, n-dodecane, n-hexanedecane, or n-octadecane; aliphatic unsaturated hydrocarbon such as 1-undecene, 1-dodecene, 1-hexadecene, or 1-octadecene; trioctylphosphine.

Among these, aliphatic unsaturated hydrocarbon having 12 or greater carbon atoms is preferable and 1-octadecene is more preferable.

<Group III Raw Material>

Specific examples of the Group III raw material to be added to the solvent include indium chloride, indium oxide, indium nitrate, indium sulfate, indium acid; aluminum phosphate, aluminum acetylacetonate, aluminum chloride, aluminum fluoride, aluminum oxide, aluminum nitrate, aluminum sulfate; gallium acetylacetonate, gallium chloride, gallium fluoride, gallium oxide, gallium nitrate, and gallium sulfate, and these may be used alone or in combination of two or more kinds thereof.

Among these, from the viewpoints of further improving the luminous efficacy and easily controlling the emission wavelength in a visible range, a compound containing In is preferable. Particularly, from the viewpoint that impurity ions such as a chloride are unlikely to be taken into the core and excellent crystallinity is easily realized, it is more preferable to use indium acetate.

<Group II Raw Material>

In the production method of the present invention, a Group II raw material containing a Group II element may be added together with the Group III raw material described above during the first step.

Specific examples of the Group II raw material including a Group II element include dimethyl zinc, diethyl zinc, zinc carboxylate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc acetate, and zinc sulfate.

Among these, from the viewpoints that impurities such as a chloride ion are not contained and the compatibility with the coordination molecule described above and the solubility in a solvent are relatively high, it is preferable to use zinc acetate, which is an acetate of Zn.

<Coordination Molecule>

Coordination molecules may be added to the solvent in the first step. Examples of the coordination molecule used in the first step are the same as those described in the section of the multicore shell particle of the present invention described above. Among those, from the viewpoints of promoting the synthesis of the semiconductor core and having an appropriate coordination force with respect to the semiconductor core, oleic acid, palmitic acid, and stearic acid are preferable.

<Conditions for Heating and Stirring>

In the first step, it is preferable that the above-described respective materials (the Group III raw material, the Group II raw material, and the coordination molecules) are dissolved in the solvent and also preferable that the coordination molecules and the Group III raw material are dissolved in the solvent by heating and stirring the solution in a temperature range of 100° C. to 180° C. At this time, it is preferable that dissolved oxygen or moisture is removed from the mixed solution, in which the coordination molecules and the Group III raw material have been dissolved, by heating the solution under reduced pressure.

Further, the time required for heating and dissolving is preferably 30 minutes or longer.

[Second Step]

The second step is a step of forming a semiconductor core by adding a Group V raw material which contains a Group V element to the solution after the first step.

It is preferable that the molar ratio of the Group V raw material added in the second step to the Group III raw material added in the first step is smaller than 0.5. In this manner, the core shell particle in which the molar ratio of the Group III element contained in the core to the Group V element contained in the entirety of the core shell particle [hereinafter, also referred to as to "molar ratio (Group III/Group V)]", which is acquired from X-ray photoelectron spectroscopy analysis (hereinafter, also referred to as "XPS"), is greater than 2.2 is obtained and the core shell particle exhibits excellent luminous efficacy.

Further, the "molar ratio of the Group V raw material added in the second step to the Group III raw material added in the first step" indicates a molar ratio of the Group V raw material added in the second step to the Group III raw material added in the first step even in a case where a part of the Group V raw material added in the second step is used as the raw material of the semiconductor shell B in the third step.

Further, from the viewpoint that a larger amount of metal cations derived from the Group III element can be present on the surface of the semiconductor core, the molar ratio of the Group V raw material added in the second step to the Group III raw material added in the first step is preferably less than 0.4 and more preferably in a range of 0.38 to 0.25.

Here, the molar ratio (Group III/Group V) is acquired in the following manner.

The molar ratio thereof is acquired by measuring the XPS of the multicore shell particle and correcting the ratio of the peak intensity of the Group III element contained in the semiconductor core to the peak intensity of the Group V element contained in the entirety of the multicore shell particle with a relative sensitivity coefficient for each element. The relative sensitivity coefficient is acquired by measuring measurement elements (measurement trajectory) to be described later related to standard samples whose compositions have been known (Journal of Surface Analysis Vol. 12 No. 3, pp. 357 (2005)).

Further, the peak intensity indicates the area intensity obtained by subtracting the background from the peak observed under the following measurement conditions and integrating the area of the peak with respect to the energy.

Further, the XPS measurement is performed by using a sample obtained by coating a non-doped Si substrate with a dispersion liquid (solvent: toluene) containing core shell particles and drying the substrate.

(Measurement Conditions)

Measuring device: Quantera SXM type XPS (manufactured by ULVAC-PHI, Inc.)

X-ray source: Al—Kα, ray (analytic diameter: 100 μm, 25 W, 15 kV)

Extraction angle of photoelectrons: 45° C.

Measurement range: 300 μm×300 μm

Correction: charging correction using combination of electron gun and low-speed ion gun Measurement elements (measurement trajectory): C (1s), N (1s), O (1s), Si (2p), P (2p), S (2p), Cl (2p), Zn (2p3/2), Ga (2p3/2), In (3d5/2)

<Group V Raw Material>

Specific examples of the Group V raw material containing a Group V element include tristrialkylsilylphosphine, trisdialkylsilylphosphine, trisdialkylaminophosphine; arsenic oxide, arsenic chloride, arsenic sulfate, arsenic bromide, arsenic iodide, nitric oxide, nitric acid, and ammonium nitrate.

Among these, a compound containing P is preferable. As the compound, it is preferable to use tristrialkylsilylphosphine or trisdialkylaminophosphine. Specifically, it is more preferable to use tristrimethylsilylphosphine.

[Third Step]

The third step is a step of forming a semiconductor shell B by adding a raw material of the semiconductor shell B to the solution after the second step.

Here, as the raw material of the semiconductor shell B, a Group II raw material containing the Group II element described above and a Group VI raw material containing the Group VI element described below are exemplified in a case where the semiconductor shell B is the Group II-VI semiconductor; and a Group III raw material containing the Group III element described above and a Group V raw material containing the Group V element described above are exemplified in a case where the semiconductor shell B is the Group III-V semiconductor described above.

Here, in a case where the semiconductor shell B is the Group III-V semiconductor described above, it is preferable that the Group III element contained in the Group III-V semiconductor is a Group III element different from the Group III element contained in the semiconductor core as described in the section of the multicore shell particle of the present invention.

Further, in a case where the semiconductor shell B is the Group III-V semiconductor described above, since the Group V raw material containing a Group V element is the same raw material as the Group V raw material forming the core, a part of the Group V raw material used in the second step may be used and only the Group III raw material may be added in the third step.

<Group IV Raw Material>

Specific examples of the Group VI raw material containing a Group VI element include sulfur, alkylthiol, trialkylphosphine sulfide, trialkenylphosphine sulfide, alkylamino sulfide, alkenylamino sulfide, cyclohexyl isothiocyanate, diethyl dithiocarbamic acid, trialkylphosphine selenium, trialkenylphosphine selenium, alkylamino selenium, alkenylamino selenium, trialkylphosphine telluride, trialkenylphosphine telluride, alkylamino telluride, and alkenylamino telluride.

Among these, from the viewpoint of excellent dispersibility of multicore shell particle to be obtained, it is preferable to use alkylthiol, specifically, more preferable to use dodecanethiol or octanethiol, and still more preferable to use dodecanethiol.

Among these materials, it is preferable to use the Group III raw material and the Group V raw material.

Particularly, as the Group III raw material, it is more preferable to use a compound containing Ga (such as gallium acetylacetonate, gallium chloride, gallium fluoride, gallium oxide, gallium nitrate, or gallium sulfate) and still more preferable to use a chloride of Ga.

In addition, as the Group V raw material, it is preferable to use a part of the Group V raw material used in the second step as described above.

[Fourth Step]

The fourth step is a step of synthesizing the multicore shell particle by adding a raw material of the semiconductor shell A to the solution after the third step to form the semiconductor shell A.

Here, as the raw material of the semiconductor shell A, a Group II raw material containing the Group II element described above and a Group VI raw material containing the Group VI element described above are exemplified in a case where the semiconductor shell A is the Group II-VI semiconductor; and a Group III raw material containing the Group III element described above and a Group V raw material containing the Group V element described above are exemplified in a case where the semiconductor shell A is the Group III-V semiconductor.

Among these raw materials, it is preferable to use the Group II raw material and the Group VI raw material.

Particularly, it is preferable to use a compound containing Zn (particularly, a carboxylate of Zn) as the Group II raw material.

Further, it is preferable to use alkylthiol as the Group VI raw material.

In the production method of the present invention, from the viewpoint that the semiconductor shell A easily contains a plurality of semiconductor cores, it is preferable that the fourth step is performed again after the fourth step. The fourth step may be performed several times after the fourth step.

Further, the molar ratio of the Group II raw material added in all steps from the first step to the fourth step to the Group III raw material added in the first step is preferably 10 or greater, more preferably 15 or greater, and still more preferably 20 or greater. With this configuration, the semiconductor shell A of the core shell particle to be obtained easily contains a plurality of semiconductor cores described above. Further, the "molar ratio of the Group II raw material added in all steps from the first step to the fourth step" indicates the molar ratio of the total value of the Group II raw material added in all steps from the first step to the fourth step, and this means that the total value of the Group II raw material includes not only the Group II raw material added in the fourth step but also the Group II raw material added in the first step in a case where the Group II raw material is also added in the first step.

[Nanoparticle Dispersion Liquid]

The nanoparticle dispersion liquid of the present invention contains the multicore shell particle of the present invention described above.

Here, an organic solvent is preferable as the solvent that disperses the core shell particles, and a hydrophobic polar organic solvent such as toluene, octane, hexane, or chloroform can be suitably used. Further, the hydrophobic polar organic solvent indicates a polar organic solvent which does not contain a functional group having a hydrogen-bonding capacity, such as a hydroxyl group, a carboxyl group, or an amino group.

The concentration of the multicore shell particles of the present invention in the nanoparticle dispersion liquid of the present invention is not particularly limited, but is preferably in a range of $0.1 \times 10^{-6}$ to $10 \times 10^{-6}$ mol/L, more preferably in a range of $0.5 \times 10^{-6}$ to $6 \times 10^{-6}$ mol/L, and still more preferably in a range of $1 \times 10^{-6}$ to $3 \times 10^{-6}$ mol/L.

The nanoparticle dispersion liquid of the present invention may contain a semiconductor core and single core shell particles having a semiconductor shell that covers at least a part of the surface of the semiconductor core, in addition to the multicore shell particles of the present invention described above.

Examples of the single core shell particle include a core shell particle, which has the semiconductor core and the semiconductor shell B described in the section of the multicore shell particle of the present invention; and a core shell particle obtained by coating at least a part of the surface of the semiconductor shell B of the core shell particle including the semiconductor core and the semiconductor shell B, described in the section of the multicore shell particle of the present invention, with another semiconductor shell (for example, a shell obtained by using the same shell material as that of the semiconductor shell A described above).

In a case where the nanoparticle dispersion liquid of the present invention contains single core shell particles, the proportion of the multicore shell particles of the present invention described above is preferably in a range of 10% to 50% and more preferably in a range of 20% to 40% with respect to the total amount of core shell particles obtained by summing the amount of multicore shell particles and the amount of single core shell particles.

Here, the amount of the multicore shell particles of the present invention is acquired as follows.

First, the nanoparticle dispersion liquid is added dropwise to a mesh for a transmission electron microscope (TEM) provided with an amorphous silicon support film and then naturally dried.

Thereafter, analysis (hereinafter, also referred to as "STEM-EDS analysis") is performed using JEM-2800 type FE-TEM (acceleration voltage of 200 kV) (manufactured by JEOL Ltd.) according to a scanning transmission electron microscope (STEM) using an energy dispersive X-ray spectrometer (EDS).

Further, for the EDS analysis, a device on which two detectors having a size of 100 mm$^2$ (manufactured by JEOL Ltd.) are mounted is used, and Noran (manufactured by Thermo Fisher Scientific) is used as an analyzer.

The proportions of the multicore shell particles and the single core particles are calculated by analyzing the form and the composition of arbitrarily-selected at least ten particles on the naturally dried mesh.

[Film]

The film of the present invention is a film containing the multicore shell particle of the present invention described above.

Since such a film of the present invention has high luminous efficacy and a narrow luminous half-width and is useful as quantum dots, the film can be applied to a wavelength conversion film used for a display, a photoelectron conversion (or wavelength conversion) film of a solar cell, a biological label, a thin film transistor, and the like.

Particularly, the film of the present invention is suitably applied to a down conversion film or a down shift type wavelength conversion film which absorbs light in a shorter wave region than that of the absorption edge of quantum dots and emits light having a long wave.

Further, the film material as a base material constituting the film of the present invention is not particularly limited and may be a resin or a thin glass film.

Specific examples thereof include resin materials mainly formed of an ionomer, polyethylene, polyvinyl chloride, polyvinylidene chloride, polyvinyl alcohol, polypropylene, polyester, polycarbonate, polystyrene, polyacrylonitrile, an ethylene vinyl acetate copolymer, an ethylene-vinyl alcohol copolymer, an ethylene-methacrylic acid copolymer film, and nylon.

EXAMPLES

Hereinafter, the present invention will be described in more detail based on examples. The materials, the use amounts, the ratios, the treatment contents, and the treatment procedures can be changed as appropriate within the range not departing from the gist of the present invention. Therefore, the scope of the present invention should not be limitatively interpreted by the following examples.

Example 1

32 mL of octadecene, 140 mg (0.48 mmol) of indium acetate, 48 mg (0.24 mmol) of zinc acetate, and 364 mg (1.44 mmol) of palmitic acid were added to a flask, heated and stirred at 110° C. in a vacuum, and degassed for 90 minutes while the raw materials were sufficiently dissolved. Next, the flask was heated to 300° C. in a nitrogen flow, and 0.24 mmol of tristrimethylsilylphosphine dissolved in approximately 4 mL of octadecene was added to the flask when the temperature of the solution was stabilized. Thereafter, the flask was heated for 120 minutes in a state in which the temperature of the solution was set to 230° C. It was confirmed that the color of the solution was red and particles (semiconductor core) were formed. Next, 30 mg (0.18 mmol) of gallium chloride and 125 μL (0.4 mmol) of oleic acid which were dissolved in 8 mL of octadecene were added to the solution in a state in which the solution was heated to 200° C., and the solution was further heated for approximately 1 hour, thereby obtaining a dispersion liquid of single core shell particles including InP (semiconductor core) doped with Zn and GaP (semiconductor shell B).

Next, the dispersion liquid was cooled to room temperature, 1100 mg (6.0 mmol) of zinc acetate was added thereto, the dispersion liquid was heated to 230° C., and the temperature thereof was maintained for approximately 4 hours. Next, 4.58 mL (19.4 mmol) of dodecanethiol was added to the dispersion liquid and the dispersion liquid was heated to 240° C. The obtained dispersion liquid was cooled to room temperature, 1100 mg (6.0 mmol) of zinc acetate was added thereto again, the dispersion liquid was heated to 230° C., and the temperature thereof was maintained for approximately 1 hour. Next, 4.58 mL (19.4 mmol) of dodecanethiol was added to the dispersion liquid again and the solution was heated to 240° C. The obtained dispersion liquid was cooled to room temperature, ethanol was added thereto, and centrifugation was performed on the dispersion liquid so that particles were precipitated. The supernatant was disposed and the resultant was dispersed in a toluene solvent. In this manner, a toluene dispersion liquid containing multicore shell particles which include a plurality of single core shell particles having InP (semiconductor core) doped with Zn and GaP (semiconductor shell B) covering the surface of the semiconductor core and in which ZnS (semiconductor shell A) was formed was obtained.

The proportion of the multicore shell particles in the obtained toluene dispersion liquid was measured according to the above-described STEM-EDS analysis, and the value was 30%.

Comparative Example 1

32 mL of octadecene, 140 mg (0.48 mmol) of indium acetate, 48 mg (0.24 mmol) of zinc acetate, and 364 mg (1.44 mmol) of palmitic acid were added to a flask, heated and stirred at 110° C. in a vacuum, and degassed for 90 minutes while the raw materials were sufficiently dissolved. Next, the flask was heated to 300° C. in a nitrogen flow, and 0.18 mmol of tristrimethylsilylphosphine dissolved in approximately 4 mL of octadecene was added to the flask when the temperature of the solution was stabilized. Thereafter, the flask was heated for 120 minutes in a state in which the temperature of the solution was set to 230° C. It was confirmed that the color of the solution was red and particles (semiconductor core) were formed. Next, 30 mg (0.18 mmol) of gallium chloride and 125 μL (0.4 mmol) of oleic acid which were dissolved in 8 mL of octadecene were added to the solution in a state in which the solution was heated to 200° C., and the solution was further heated for approximately 1 hour, thereby obtaining a dispersion liquid of single core shell particles including InP (semiconductor core) doped with Zn and GaP (first semiconductor shell).

Next, the dispersion liquid was cooled to room temperature, 330 mg (1.8 mmol) of zinc acetate was added thereto, the dispersion liquid was heated to 230° C., and the temperature thereof was maintained for approximately 4 hours. Next, 1.17 mL (7.5 mmol) of dodecanethiol was added to the dispersion liquid and the dispersion liquid was heated to 240° C. The obtained dispersion liquid was cooled to room temperature, ethanol was added thereto, and centrifugation was performed on the dispersion liquid so that particles were precipitated. The supernatant was disposed and the resultant was dispersed in a toluene solvent. In this manner, a toluene dispersion liquid of single core shell particles including InP (semiconductor core) doped with Zn, GaP (first semiconductor shell) covering the surface of the core, and ZnS (second semiconductor shell) covering the surface of the first semiconductor shell was obtained.

The proportion of the multicore shell particles in the obtained toluene dispersion liquid was measured according to the above-described STEM-EDS analysis, and the value was 0%.

Examples 2 to 4

The toluene dispersion liquid prepared in Example 1 and the toluene dispersion liquid prepared in Comparative Example 1 were mixed so as to have the proportion of the multicore shell particles listed in Table 1, thereby obtaining a toluene dispersion liquid.

Comparative Example 2

A toluene dispersion liquid of commercially available core shell particles (manufactured by NN-LABS, LLC) including a semiconductor core formed of InP and a semiconductor shell formed of ZnS was used.

The proportion of the multicore shell particles in the obtained toluene dispersion liquid was measured according to the above-described STEM-EDS analysis, and the value was 0%.

<Photostability>

Each dispersion liquid prepared or used in Examples 1 to 4 and Comparative Examples 1 and 2 was diluted with toluene such that the absorbance was set to approximately 0.2, sealed in a vial bottle in air, and then used as a measurement sample.

Further, the measurement sample was irradiated with ultraviolet rays having a wavelength of 365 nm at an intensity of 1 mW/cm$^2$ for 24 hours.

The emission intensity of the sample was measured before and after the irradiation with ultraviolet rays using a fluorescence spectrophotometer FluoroMax-3 (manufactured by HORIBA Jobin Yvon) and the reduction rate of the emission intensity was calculated from the following table. The results are listed in Table 1 together with the proportions of the multicore shell in each dispersion liquid.

Reduction rate=(emission intensity after irradiation with ultraviolet rays/emission intensity before irradiation with ultraviolet rays)×100

TABLE 1

| | Proportion of multicore shell particles (%) | Photostability Reduction rate of emission intensity (%) |
|---|---|---|
| Example 1 | 30 | 11.60 |
| Example 2 | 20 | 12.60 |
| Example 3 | 10 | 15.00 |
| Example 4 | 5 | 18.30 |
| Comparative Example 1 | 0 | 20.50 |
| Comparative Example 2 | 0 | 63.20 |

From the results listed in Table 1, it was understood that the reduction rate of the emission intensity was increased and thus the photostability was degraded in a case of the dispersion liquid in which core shell particles (multicore shell particles) including the semiconductor shell A having a plurality of semiconductor cores were not present (Comparative Examples 1 and 2).

On the contrary, it was understood that a decrease in luminous efficacy can be suppressed and the photostability was excellent in a case of the dispersion liquid in which multicore shell particles were present (Examples 1 to 4).

What is claimed is:
1. A multicore shell particle comprising:
a plurality of semiconductor cores; and
a semiconductor shell A which contains the plurality of semiconductor cores,
wherein each of the plurality of semiconductor cores independently has a semiconductor shell B which covers at least a part of a surface of the semiconductor core,
wherein in a core shell particle comprising the semiconductor core and the semiconductor shell B, the molar ratio of a Group III element contained in the semiconductor core to a Group V element contained in the core shell particle is greater than 2.2,
wherein the semiconductor shell B is a Group III-V semiconductor, which contains the Group III element and the Group V element,
the Group III element is Ga, and
the Group V element is P.
2. The multicore shell particle according to claim 1, wherein each of the plurality of semiconductor cores is a semiconductor core which contains a Group III element and a Group V element.
3. The multicore shell particle according to claim 2, wherein the Group III element contained in the semiconductor core is In, and
the Group V element contained in the semiconductor core is any of P, N, and As.
4. The multicore shell particle according to claim 2, wherein the Group III element contained in the semiconductor core is In, and
the Group V element contained in the semiconductor core is P.
5. The multicore shell particle according to claim 2, wherein the semiconductor core further contains a Group II element.
6. The multicore shell particle according to claim 5, wherein the Group II element contained in the semiconductor core is Zn.
7. A nanoparticle dispersion liquid which contains the multicore shell particle according to claim 1.
8. The nanoparticle dispersion liquid according to claim 7, which further contains a single core shell particle which includes a semiconductor core and a semiconductor shell covering at least a part of a surface of the semiconductor core.

9. The nanoparticle dispersion liquid according to claim 8, wherein the proportion of the multicore shell particle is in a range of 10% to 50% with respect to the total amount of the core shell particle obtained by summing the amount of the multicore shell particle and the amount of the single core shell particle.

10. A film which contains the multicore shell particle according to claim 1.

\* \* \* \* \*